US007288811B2

(12) United States Patent
Tsunoda et al.

(10) Patent No.: US 7,288,811 B2
(45) Date of Patent: Oct. 30, 2007

(54) DIRECT TUNNELING MEMORY WITH SEPARATED TRANSISTOR AND TUNNEL AREAS

(75) Inventors: Kouji Tsunoda, Kawasaki (JP); Tatsuya Usuki, Kawasaki (JP); Masao Taguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 418 days.

(21) Appl. No.: 11/037,176

(22) Filed: Jan. 19, 2005

(65) Prior Publication Data
US 2005/0230741 A1    Oct. 20, 2005

(30) Foreign Application Priority Data
Apr. 14, 2004    (JP) .............................. 2004-118948

(51) Int. Cl.
H01L 29/76    (2006.01)
H01L 29/788    (2006.01)
(52) U.S. Cl. ....................... 257/315; 257/316
(58) Field of Classification Search ......... 257/314–324
See application file for complete search history.

(56) References Cited
U.S. PATENT DOCUMENTS
6,195,292 B1    2/2001    Usuki et al.

7,208,795 B2*    4/2007    Carver et al. ............... 257/315

FOREIGN PATENT DOCUMENTS
JP    2000-150680    5/2000

OTHER PUBLICATIONS
Tatsuya Usuki et al., "Advantage of a Quasi-Nonvolatile Memory with Ultra Thin Oxide", Extended Abstract of the 2001 International Conference on Solid State Devices and Material, Tokyo, 2001., pp. 532-533.

* cited by examiner

Primary Examiner—Cuong Nguyen
(74) Attorney, Agent, or Firm—Westerman, Hattori, Daniels & Adrian, LLP.

(57) ABSTRACT

A semiconductor device has: an isolation region formed on a semiconductor substrate and defining a continuous active region including a select transistor region and a direct tunnel element region; a gate insulating film formed on a channel region of the select transistor region; a tunnel insulating film formed on a partial area of the direct tunnel element region and having a thickness different from a thickness of the gate insulating film; a continuous floating gate electrode formed above the gate insulating film and the tunnel insulating film; an inter-electrode insulating film formed on a surface of the floating gate electrode; a control gate electrode facing the floating gate electrode via the inter-electrode insulating film; and a pair of source/drain regions formed on both sides of the channel region of the select transistor region and not overlapping the tunnel insulating film.

10 Claims, 13 Drawing Sheets

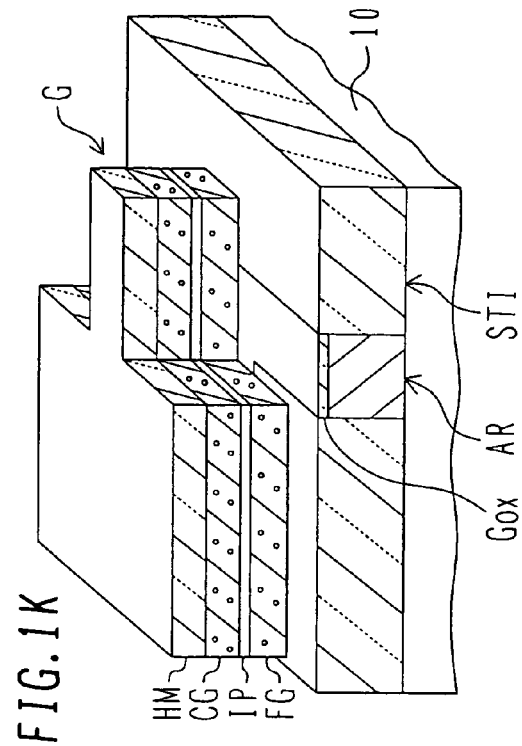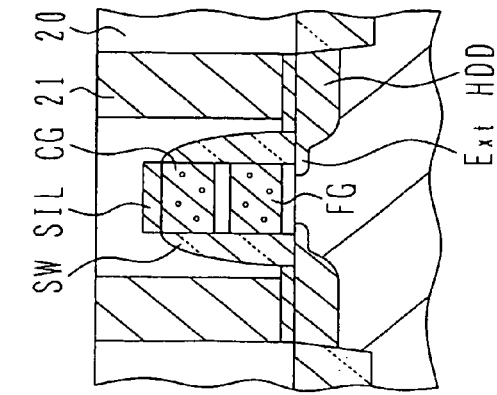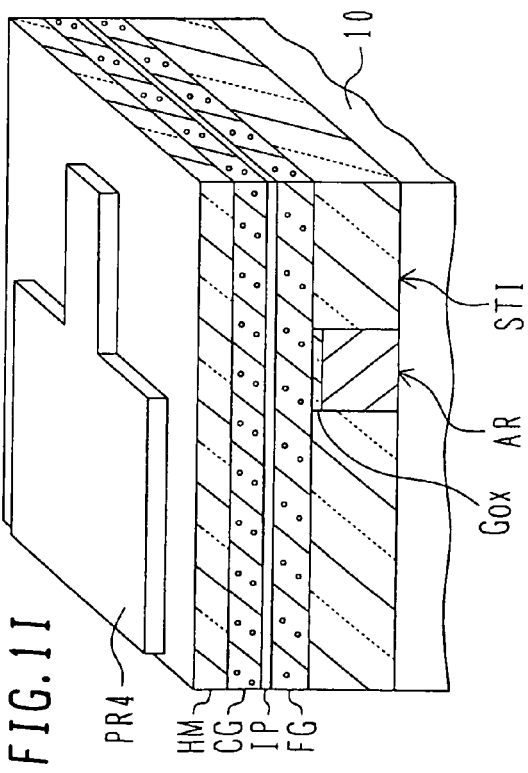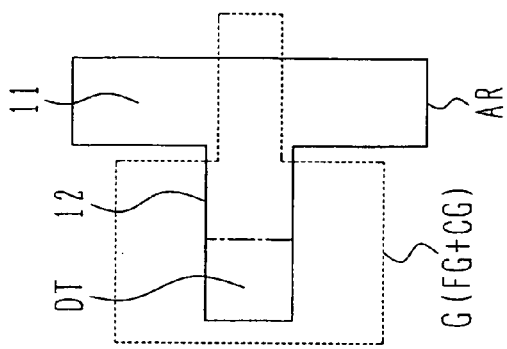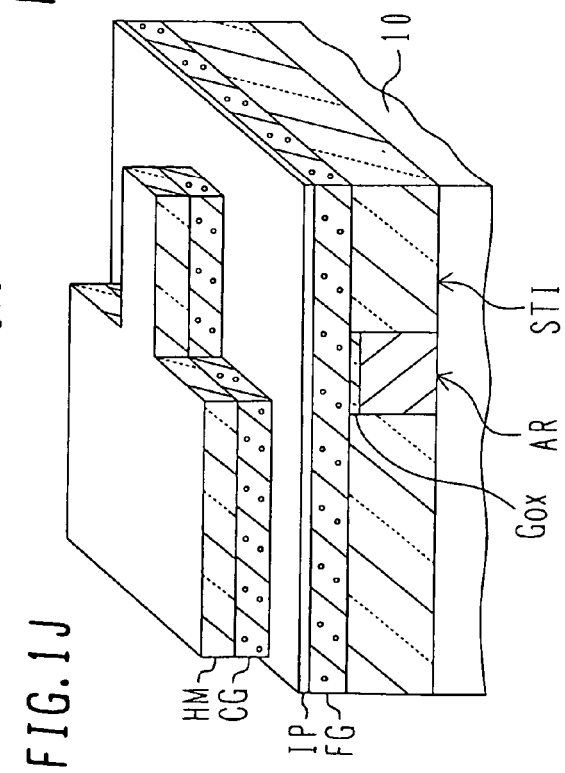

FIG. 5A
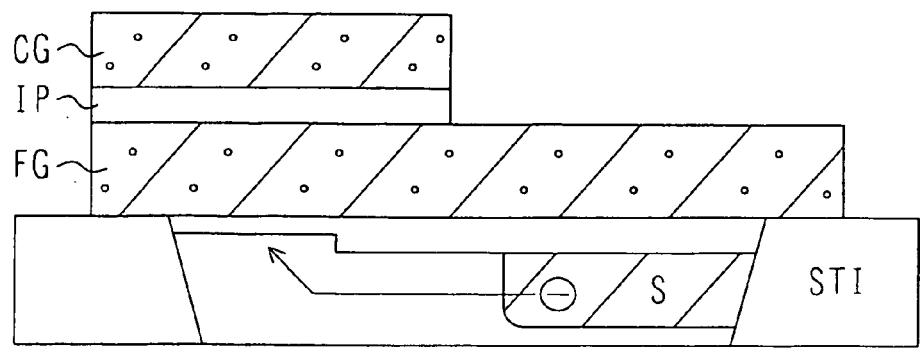
FIG. 5B
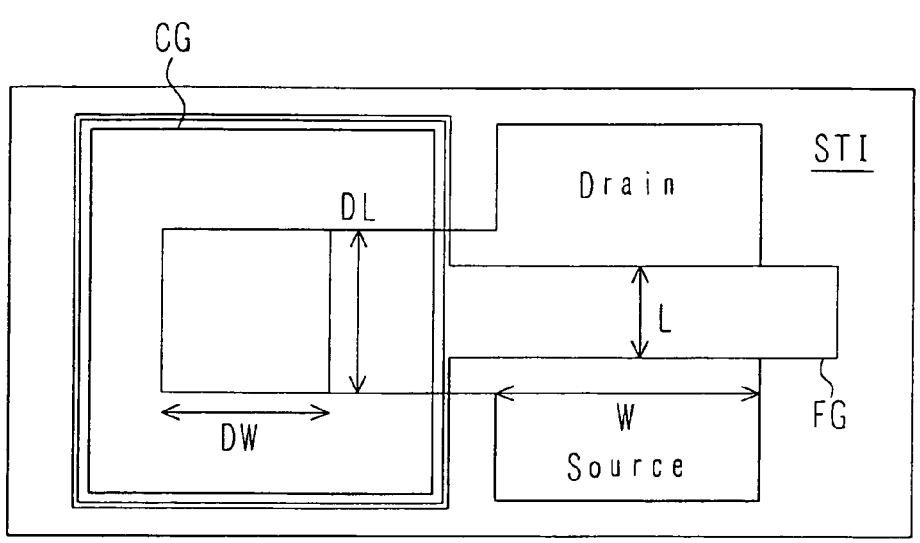
FIG. 5C
| OPERATION VOLTAGE (V) | CG | D | S | B |
|---|---|---|---|---|
| WRITE | 5 | 0 | 0 | 0 |
| ERASE | -5 | 0 | 0 | 0 |
| READ | 1 | 1 | 0 | 0 |

DIRECT TUNNELING MEMORY WITH SEPARATED TRANSISTOR AND TUNNEL AREAS

CROSS REFERENCE TO RELATED APPLICATION

This application is based on and claims priority of Japanese Patent Application No. 2004-118948 filed on Apr. 14, 2004, the entire contents of which are incorporated herein by reference.

BACKGROUND OF THE INVENTION

A) Field of the Invention

The present invention relates to a semiconductor device and its manufacture method, and more particularly to a semiconductor device having memory cells capable of utilizing the direct tunneling phenomenon and its manufacture method.

B) Description of the Related Art

There have been strong demands for multi functional semiconductor devices which integrate logic circuits and memory cells. A logic circuit is often made of CMOS circuits. It is desired to form both CMOS transistors and memory cells by common manufacture processes as much as possible. There is an increasing demand for memory cells to form random access memories (RAM) among others.

Although a static (S) RAM has a strong compatibility with logic circuit processes, it occupies a large area. A dynamic (D) RAM requires a capacitor, and a recent micro capacitor has a complicated structure resulting in a large increase in cost. Novel nonvolatile memories such as ferroelectric memories, magnetic memories and phase change memories require involvement of new materials, have an insufficient compatibility with logic circuit processes, and are high in cost.

A flash memory has the lamination structure of a floating gate electrode of polysilicon, an inter-poly (inter-electrode) insulating film and a control gate electrode of polysilicon, respectively stacked on a gate insulating film. The flash memory has a good compatibility with logic processes, occupies a small area and can be manufactured at low cost.

FIG. 11A is a schematic diagram showing the structure of a flash memory. On a p-type region of a silicon substrate 100, a tunnel insulating film 101 is formed, for example, by a thermal oxide film having a thickness of 8 nm. On the tunnel insulating film, a floating gate (FG) electrode 102 of polysilicon, an inter-poly (inter-electrode) insulating film 103 and a control gate (CG) electrode 104 of polysilicon are stacked and patterned in the same plan shape. The side walls of the polysilicon are covered with a thermal oxide film 105, and side wall spacers 106 of silicon oxide or the like are formed on the thermal oxide films. On both sides of the stacked gate electrode, high concentration n-type source/drain regions 108 and 110 and shallow n-type extension regions 107 and 109 are formed. The high concentration n-type region 108 and n-type extension region 107 are collectively called a source S. The high concentration n-type region 110 and n-type extension region 109 are collectively called a drain D.

In a write operation, a ground potential is applied to the source S, and a positive polarity high voltage is applied to the drain D and control gate CG. Electrons travel from the source S toward the drain D, and take a hot state due to a high electric field. Since the control gate CG is applied with a positive polarity high voltage, hot carriers receive an upward acceleration, tunnel through the tunnel insulating film, and are injected into the floating gate FG.

Channel hot electrons (CHE) are injected in this manner. Information is stored by the charges accumulated in the floating gate FG. The floating gate FG covered with the insulating films has a charge retention function and constitutes a nonvolatile memory. In erasing the stored information, a negative polarity high voltage is applied to the control gate CG so that Fowler-Nordheim (FN) current flows through the tunnel insulating film 101 and carriers (electrons) are pulled out.

The tunneling oxide film of a flash memory is deteriorated because carriers of hot electrons are injected into the floating gate FG in the state that a high voltage is applied to the tunnel oxide film and because electrons are tunneled through the tunnel oxide film by applying a very high voltage. Endurance against the write/erase cycles is about $10^5$ times. Since the number of rewrite operations is limited although information can be rewritten, the use of this flash memory is limited to a ROM-like device. The write process of channel hot electrons has the poor injection efficiency so that a consumption power increases. Since an erase process uses the Fowler-Nordheim (FN) tunneling phenomenon, a high electric field is required although it provides the high injection efficiency, and an erase speed is very slow as compared to a write speed. As described above, a flash memory has several problems.

A direct tunneling memory (DTM) has been proposed which has a good compatibility with logic processes and a floating gate electrode structure made of a lamination of a polysilicon layer and an insulating layer similar to the flash memory. The direct tunneling memory is a memory having a thin tunnel insulating film allowing carriers directly tunneling through the film.

FIG. 11B is a schematic diagram showing an example of the structure of a direct tunneling memory. On the surface of a p-type region of a silicon substrate 100, a tunnel insulating film 111 is formed by a thermal oxide film having a thickness of 3 nm or thinner allowing carriers to directly tunnel through the film. On the tunnel insulating film, a floating gate electrode 112 of polysilicon is formed and patterned. The upper surface of the floating gate electrode 112 is covered with an insulating film 115. The side walls of the floating gate is covered with an insulating film 113 on which control gate electrodes 114 of n-type polysilicon are formed facing each other.

Under the control gate electrodes 114 and insulating films 113, high concentration n-type source/drain regions 118 and 120 with n-type extensions 117 and 119 are formed. The control gate electrode 114 faces the silicon surface via a relatively thick gate insulating film 113. Insulating side wall spacers 116 are formed on the side walls of the control gate electrodes 114.

In a write operation, a positive high voltage is applied to the control gate CG. Because of capacitive coupling, a voltage is also applied to the floating gate FG so that an electric field is applied to the tunnel insulating film. A channel connected to the source (S) and drain (D) is induced under the control gates CG and floating gate FG. Carriers (electrons) can reach under the floating gate from the source S/drain D to the channel. Since the tunnel insulating film 111 under the floating gate FG is very thin, a high speed write operation by electron direct tunneling can be performed at a low voltage and a low consumption power relative to the flash memory.

As the voltage applied to the control gate CG is released, the channel extinguishes. The extensions 117 and 119 of the source/drain are not overlapped with the floating gate FG and are distracted sideways. It is therefore possible to suppress the leak current from the floating gate electrode.

As a voltage equal to or higher than a threshold value for inducing a channel is applied to the control gate CG and a forward bias is applied to the drain D, the path between the source S and drain D becomes conductive depending upon the charge state of the floating gate FG so that the stored information can be read. If electrons (negative charges) are not accumulated in the floating gate FG, the channel is induced also under the floating gate FG so that the path between the source S and drain D of the transistor turns on. If negative charges are accumulated in the floating gate and the forward bias is cancelled out, the channel under the floating gate FG is extinguished so that the path between the source S and drain D of the transistor turns off.

In erasing the information, a negative high voltage is applied to the control gate. Negative charges (electrons) in the floating gate receive a repulsion force, tunnel through the tunnel insulating film 111 and pulled out into the substrate 100.

In the structure shown in FIG. 11B, the thin tunnel insulating film having a thickness of 3 nm or thinner separates the floating gate electrode 112 from the channel region in the silicon substrate. Since the insulating film 111 is very thin, the charge retention characteristics of the floating gate electrode 112 are deteriorated. In order to hold the information stored in the floating gate even if the transistor becomes volatile, a refresh operation is performed similar to a DRAM. By using direct tunneling, the tunnel insulating film is suppressed from being deteriorated and the endurance characteristics improve greatly. It is therefore possible to use it as a RAM.

Refer to JP-A-2000-150680, U.S. Pat. No. 6,195,292 and "Advantage of a quasi-nonvolatile memory with ultra thin oxide" SSDM2001, p. 532(2001) by T. Usuki, N. Horiguchi and T. Futatsugi, which are incorporated herein by reference.

Although a direct tunneling memory has a bright future, forming the control gates on the side walls degrades the integrity with logical transistor manufacture processes. Furthermore, in the state that the drain current is detected by turning on the select transistor which discriminates the charge state of the floating gate, the channel is induced at least under the control gate so that charges are likely to be injected into the floating gate.

SUMMARY OF THE INVENTION

An object of this invention is to provide a direct tunneling memory with novel features.

Another object of this invention is to provide a method of manufacturing a direct tunneling memory with novel features.

Still another object of this invention is to provide a direct tunneling memory which has a direct tunnel region for writing charge information in a floating gate through direct tunneling and a select transistor region for reading charge information, respectively formed in separated areas, and its manufacture method.

According to one aspect of the present invention, there is provided a semiconductor device comprising: a semiconductor substrate; an isolation region formed on the semiconductor substrate and defining a continuous active region including a select transistor region and a direct tunnel element region; a gate insulating film formed on a channel region of the select transistor region; a tunnel insulating film formed on a partial area of the direct tunnel element region and having a thickness different from a thickness of the gate insulating film; a continuous floating gate electrode formed above an area including the gate insulating film and the tunnel insulating film; an inter-electrode insulating film formed on a surface of the floating gate electrode; a control gate electrode facing the floating gate electrode via the inter-electrode insulating film; and a pair of source/drain regions formed on both sides of the channel region of the select transistor region and not overlapping the tunnel insulating film.

According to another aspect of the present invention, there is provided a semiconductor device manufacturing method comprising steps of: (a) forming an isolation region on a semiconductor substrate, the isolation region defining a continuous active region including a select transistor region and a direct tunnel element region; (b) forming a gate insulating film on a channel region of the select transistor region; (c) forming a tunnel insulating film on a partial area of the direct tunnel element region, the tunnel insulating film having a thickness different from a thickness of the gate insulating film; (d) forming a continuous floating gate electrode layer above an area including the gate insulating film and the tunnel insulating film; (e) forming an inter-electrode insulating film on a surface of the floating gate electrode; (f) forming a control gate electrode layer on the inter-electrode insulating film; (g) patterning the control gate electrode layer, the inter-electrode insulating film and the floating gate electrode layer; and (h) forming a pair of source/drain regions on both sides of the channel region of the select transistor region, the pair of source/drain regions not overlapping the tunnel insulating film.

A direct tunneling memory is separated into a direct tunnel element for performing direct tunneling between the floating gate and substrate and a select transistor for reading a charge state in the floating gate. Without using control gates formed on the side walls, the area where direct tunneling is performed can be separated from the area where the select transistor is formed. Compatibility with logic transistor manufacture processes can be improved. Disturb during a read operation can be mitigated. By adopting this structure, the characteristics of a select transistor and a direct tunnel element can be optimized.

A select transistor can be structured in such a manner that it has a low threshold value and a small leak current through the gate insulating film. The direct tunnel element can be structured in such a manner that it has a high threshold value and a large tunnel current at a value equal to or higher than the threshold value.

BRIEF DESCRIPTION OF THE DRAWINGS

FIGS. 1A to 1M are perspective views, a plan view and a cross sectional view illustrating manufacture processes for a direct tunneling memory according to a first embodiment of the invention.

FIGS. 5A, 5B and 5C are a cross sectional view, a plan view and a table illustrating the structure and operation of the second embodiment.

DESCRIPTION OF THE PREFERRED EMBODIMENTS

FIGS. 1A to 1K are perspective views illustrating manufacture processes for a direct tunneling memory according to the first embodiment of the invention.

Figure 1A:
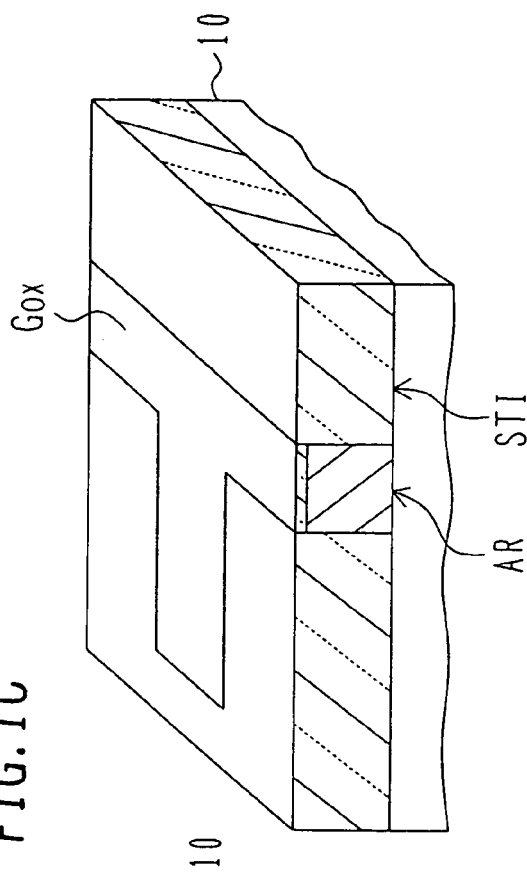

As shown in FIG. 1A, on the surface of the silicon substrate 10, a shallow trench isolation STI is formed defining active regions AR, the active region AR including a select (read) transistor region 11 and a direct tunnel element region 12 respectively formed integrally. The select transistor region 11 is used for reading a charge state of a floating gate. The direct tunnel element region 12 is used for writing carriers in the floating gate and erasing carriers therefrom, through direct tunneling. Ions suitable for the select transistor, e.g., boron (B), are implanted in the whole active region AR to thereby adjust the threshold value Vth of the select transistor.

A select transistor structure for reading the charge state of the floating gate is formed by forming a floating gate traversing the middle area of the select transistor region and by forming source/drain regions on both sides of the floating gate.

In the direct tunnel element region, the floating gate is disposed above the semiconductor substrate via a tunnel insulating film thin enough for direct tunneling between the substrate and floating gate, and charge write/erase is performed relative to the floating gate. A control gate is disposed above the floating gate, with an inter-electrode insulating layer being disposed therebetween.

The area use factor is restricted by disposing the direct tunnel element region in addition to the select transistor region. However, the characteristics of the direct tunnel element and the characteristics of the select transistor can be set independently. The disturbance (write error) during a read operation can be prevented by setting the threshold value of the direct tunnel element higher than that of the select transistor.

Figure 1B:
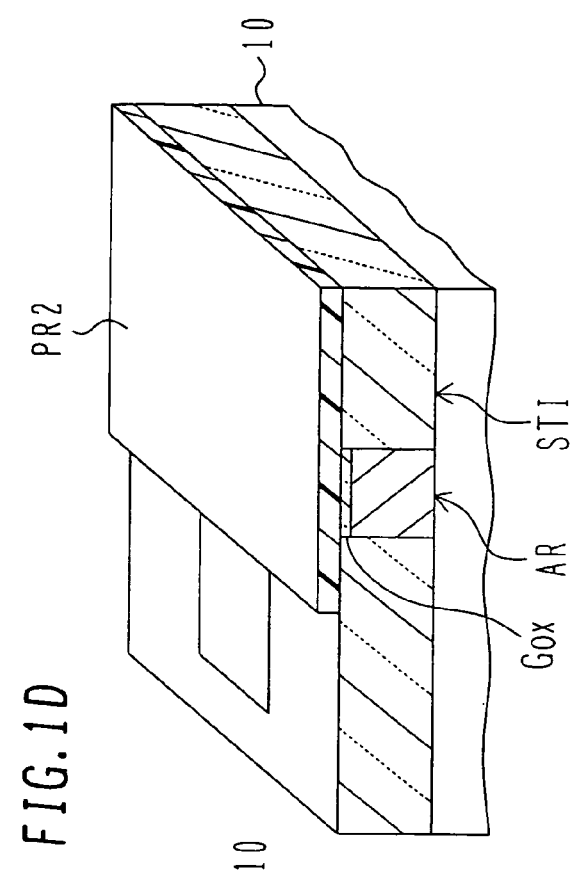

As shown in FIG. 1B, a photoresist mask PR1 is formed having an opening covering the select transistor region 11 and exposing a direct tunnel region, and ions, e.g., B, are additionally implanted to raise the threshold value Vth of the direct tunnel region. By setting the threshold value of the direct tunnel region high, it becomes possible to realize the state that a channel is still not induced in the direct tunnel region even under the state that the select transistor region is turned on.

The photoresist pattern PR1 is thereafter removed by ashing. Then, annealing is performed, for example, for 10 seconds at 1000° C. to activate implanted impurity ions.

Figure 1C:
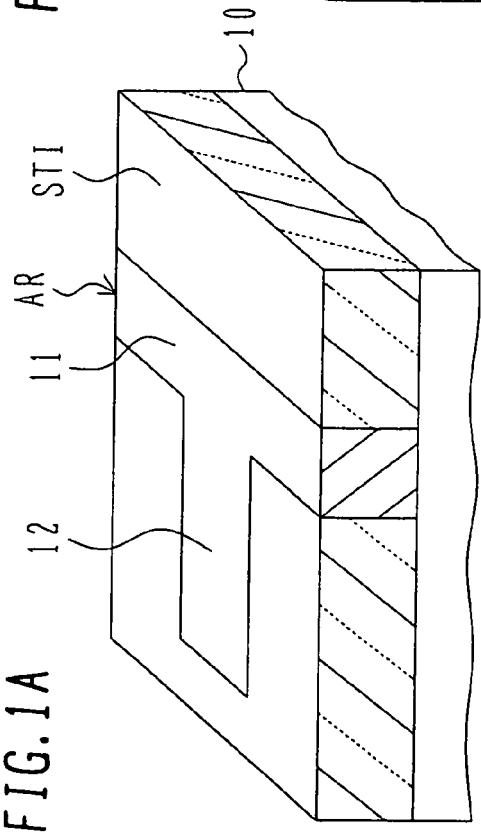

As shown in FIG. 1C, the surface of the active region AR is thermally oxidized at 750° C. to 900° C. to form a gate oxide film Gox having a thickness of 1 nm to 8 nm. This gate oxide film has a thickness appropriate for the select transistor.

Figure 1D:
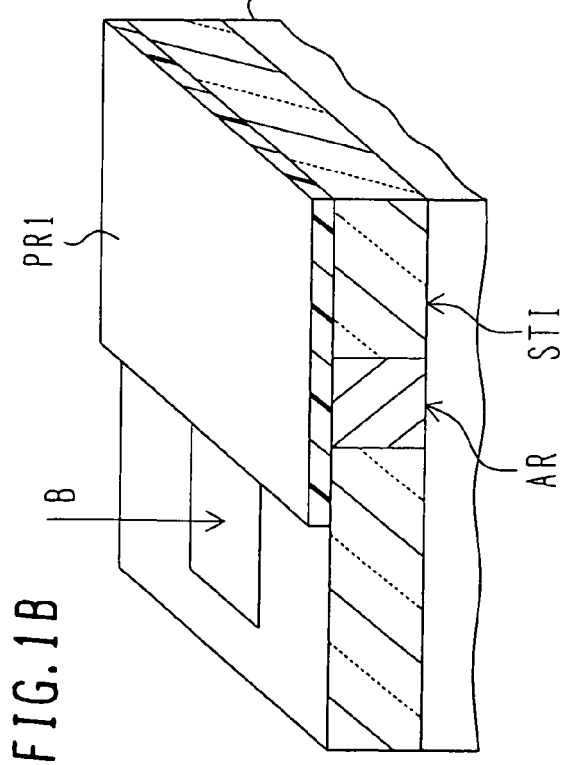

As shown in FIG. 1D, a photoresist pattern PR2 is formed covering the select transistor region. This photoresist pattern PR2 has such a shape as the inner area of the direct tunnel region in which ions are implanted additionally at the process shown in FIG. 1B.

Figure 1E:
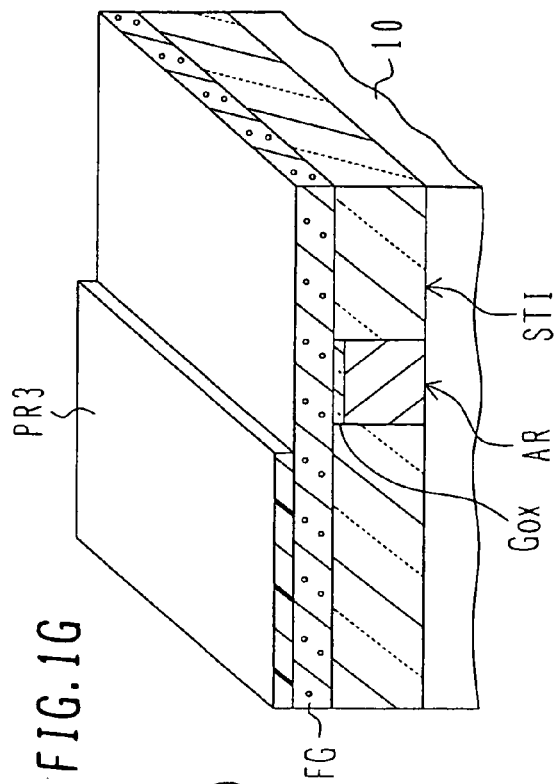

As shown in FIG. 1E, etching with dilute hydrofluoric acid is executed to remove the gate oxide film Gox exposed by the photoresist pattern PR2 and expose the silicon surface in the direct tunnel region. The photoresist pattern PR2 is thereafter removed by ashing.

Figure 1G:
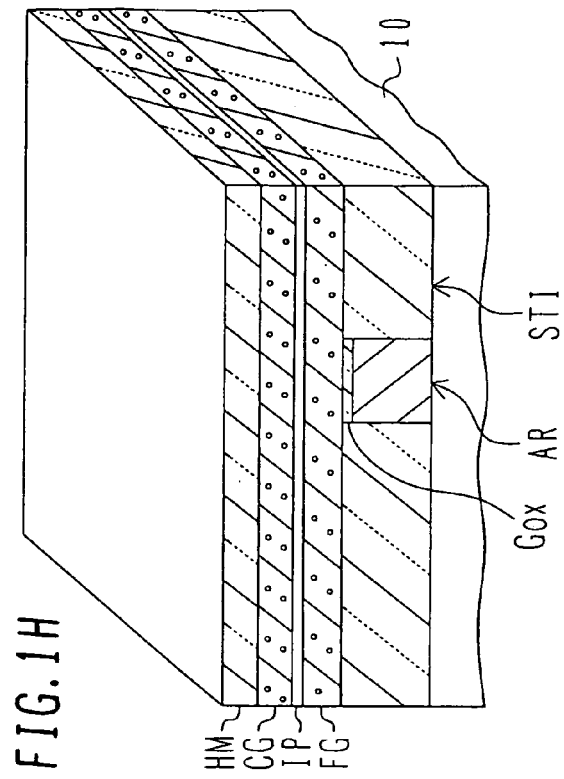
Figure 1F:
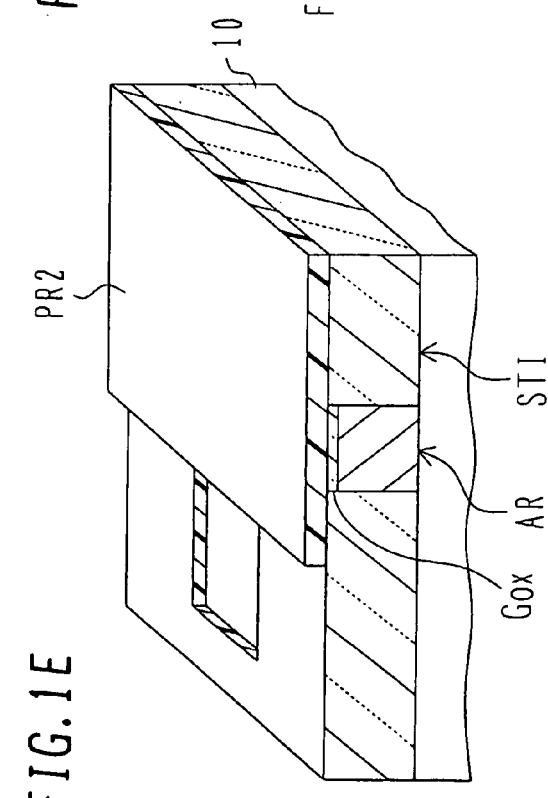

As shown in FIG. 1F, the silicon surface exposed in the direct tunnel region is thermally oxidized at 750° C. to 900° C. to form a tunnel oxide film Tox having a thickness of 1 nm to 3 nm. In this case, the thickness of the gate oxide film Gox formed previously increases slightly. For example, the tunnel oxide (insulating) film has a thickness of 3 nm and the gate oxide (insulating) film has a thickness of 8 nm.

If a very thin gate insulating film having a thickness of, e.g., 2 nm is formed, an oxide film with nitrogen being introduced into the surface layer thereof may be formed, or a lamination of high dielectric insulating films thinning a thickness converted into that of an oxide film and thickening an actual thickness may be used, respectively in order to suppress the tunneling phenomenon. The tunnel insulating film presents the tunneling phenomenon and may be an insulating film other than an oxide film or an insulating lamination film.

The region 12 shown in FIG. 1A extending sideways from the select transistor region 11 and called the direct tunnel element region has the direct tunnel region defined therein and the tunnel insulating layer disposed in the direct tunnel region. The region where information is written and erased via the tunnel insulating layer is spaced apart from the select transistor, particularly its carrier travelling region.

On the substrate formed with the gate oxide film Gox and tunnel oxide film Tox, a polysilicon layer FG having a thickness of 50 to 200 nm is deposited by chemical vapor deposition (CVD). Phosphorus (P) ions are implanted into the whole polysilicon layer at an impurity concentration appropriate for the floating gate electrode.

As shown in FIG. 1G, a photoresist pattern PR3 is formed covering the direct tunnel region and P ions are further implanted into the polysilicon layer in the select transistor region to set the impurity concentration appropriate for the transistor gate electrode. The impurity concentration of the floating gate of the direct tunnel element is therefore restricted so that the characteristics of the floating gate electrode can be adjusted. The photoresist pattern PR3 is thereafter removed by ashing, and annealing is performed for 30 minutes at 700° C. to 900° C. to activate the implanted impurities.

Figure 1H:
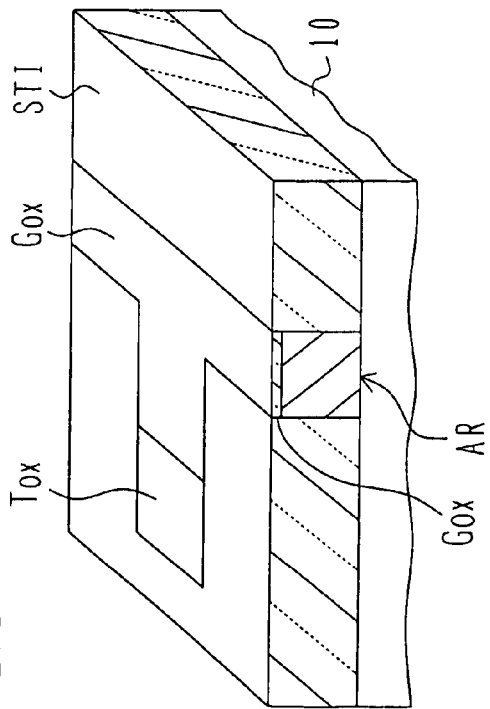

As shown in FIG. 1H, an inter-poly insulating layer IP of silicon oxide having a thickness of 5 nm to 30 nm is deposited by CVD on the floating gate electrode FG. The inter-poly insulating layer IP may be formed by thermal oxidation. A control gate electrode layer CG of doped polysilicon having a thickness of 50 nm to 150 nm is deposited by CVD on the inter-poly insulating layer IP. A silicon oxide layer HM having a thickness of 50 nm to 100 nm is deposited by CVD on the polysilicon layer CG. The silicon oxide layer HM is used for forming a hard mask.

As shown in FIG. 1I, a photoresist pattern PR4 having a gate electrode shape is formed on the hard mask layer HM.

By using the photoresist pattern PR4 as a mask, the hard mask layer HM and control gate electrode layer CG are etched. The photoresist pattern PR4 is thereafter removed by ashing.

FIG. 1J shows the state that the hard mask layer HM and control gate electrode layer CG were patterned and the photoresist pattern was removed. The polysilicon layer for the floating gate electrode is left on the whole substrate surface.

As shown in FIG. 1K, by using the hard mask HM as an etching mask, the inter-poly insulating layer IP and floating gate electrode FG under the control gate electrode CG are etched. In this etching process, the gate electrodes of a logic circuit in another region (not shown) can be patterned by using a photoresist pattern.

FIG. 1L shows the plan layout of the active region AR and the laminated gate electrodes G. The active region AR has the select transistor region 11 and the direct tunnel element region 12. The gate electrode G has the lamination structure of the floating gate FG and the control gate CG. This structure forms in the select transistor region 11 a gate electrode, and in the direct tunnel region DT spaced apart from the select transistor region the structure allowing carriers to be written and erased through direct tunneling.

As a forward bias, e.g., 1 V, is applied to the control gate, a channel can be induced under the select transistor. In the process of reading stored information in the normally on-state of the select transistor region 11, the channel is not still induced in the direct tunnel region 12 so that injection of carriers into the floating gate can be suppressed.

As a higher forward bias, e.g., 5 V, is applied, the channel can be induced under the whole region of the gate electrode, and the floating gate on the tunnel insulating layer Tox faces the induced channel. In this state, the channel in the select transistor region 11 and the channel in the direct tunnel region DT are electrically connected. It is therefore possible to supply carriers from the high concentration source/drain region to the direct tunnel region DT.

FIG. 1M shows the structure of the select transistor formed by general transistor manufacture processes. After the process shown in FIG. 1K, arsenic ions are implanted to form extension regions Ext and impurities are activated by annealing for 10 seconds at 1000° C. A silicon oxide layer is deposited by CVD to a thickness of 50 nm to 150 nm and etched back. In this case, the silicon oxide layer used as the hard mask layer HM is also etched to expose the surface of the control gate electrode CG. Side wall spacers SW are therefore formed on the side walls of the laminated gate electrodes. In this state, phosphorus ions are implanted to form high concentration regions HDD of the source and drain. Annealing is performed for 10 seconds at 1000° C. to activate the impurities.

A cobalt layer is deposited to a thickness of 5 nm to 30 nm and then a TiN layer is deposited to a thickness of 5 nm to 50 nm, by physical vapor deposition (PVD) such as sputtering. Rapid thermal annealing (RTA) is performed for 30 seconds at 500° C. to 550° C. to form cobalt silicide. Unreacted metal is removed by wet etching using a liquid mixture of sulfuric acid and hydrogen peroxide. RTA is performed for 30 seconds at 800° C. to 900° C. to lower the resistance of the silicide layer SIL. Thereafter, an interlayer insulating film 20 is formed, and conduct plugs are buried in the interlayer insulating film to guide the source/drain to the upper surface. The process of forming an interlayer insulating film and a wiring is repeated a necessary number of times.

The direct tunneling memory of the first embodiment has a high compatibility with logic processes. FIGS. 2A to 2D illustrate manufacture processes for both a direct tunneling memory and a logic circuit. The manufacture processes for the direct tunneling memory are similar to those shown in FIGS. 1A to 1M.

A logic circuit generally uses a plurality type of transistors having different gate insulating film thicknesses. If the thickness of the tunnel insulating film of the direct tunnel element is the same as one of the gate insulating film thicknesses of the logic circuit, the same manufacture process can be shared. If the same gate insulating film thickness does not exist, the process of forming a tunnel gate insulating film is additionally used. It is preferable to make the gate insulating film of the select transistor be the same as one of the gate insulating films of the logic circuit.

Figure 2A:
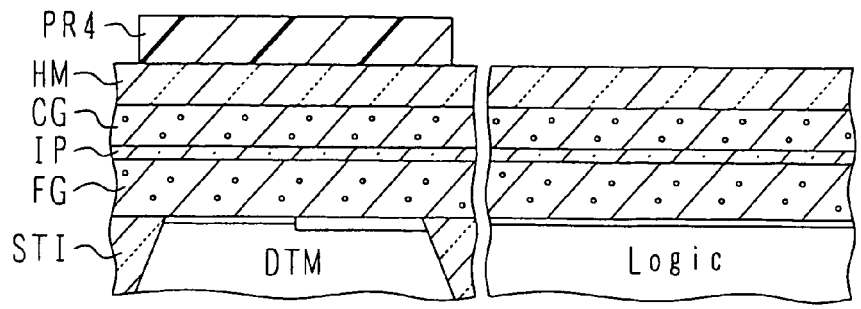
FIGS. 2A to 2D are cross sectional views illustrating the compatibility with logic transistor manufacture processes according to the first embodiment.

FIG. 2A shows the state corresponding to FIG. I wherein the gate oxide film, tunnel oxide film, floating gate electrode layer FG, inter-poly insulating layer IP, control gate electrode layer CG and hard mask layer HM are stacked upon the substrate and then the photoresist pattern PR4 is formed on the lamination structure. In the logic circuit region, a photoresist pattern is not formed but the whole surface of the hard mask layer HM is exposed.

Figure 2B:
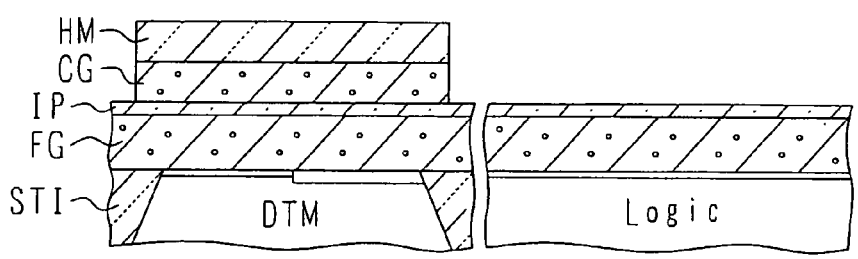

As shown in FIG. 2B, by using the photoresist pattern PR4 as a mask, the hard mask layer HM and control gate layer CG are etched. In the logic circuit region, the hard mask layer HM and control gate layer CG are completely etched and removed.

Figure 2C:
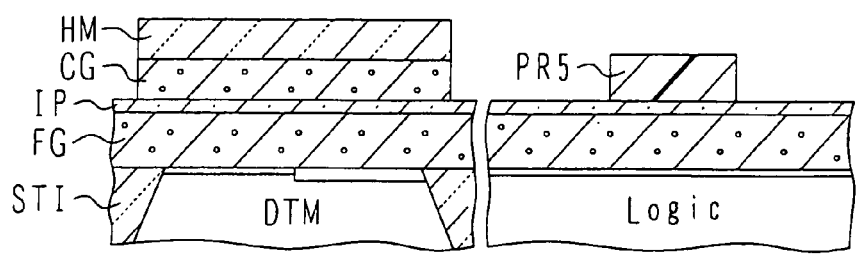

As shown in FIG. 2C, before the floating gate electrode layer FG is etched, a photoresist pattern PR5 is formed in the logic circuit region. This photoresist pattern PR5 is used for patterning gate electrodes of the logic circuit.

Figure 2D:
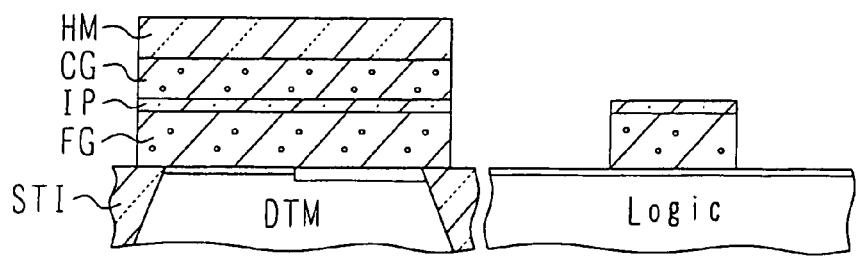

As shown in FIG. 2D, in the direct tunneling memory region, the hard mask layer HM is used as an etching mask, and in the logic circuit region, the photoresist pattern PR5 is used as an etching mask. By using these masks, the inter-poly insulating layer IP and floating gate layer FG are etched. The photoresist pattern PR5 is thereafter removed by ashing. In this manner, logic transistors can be formed in the logic circuit region by using direct tunneling memory manufacture processes. If a CMOS circuit is to be formed in the logic circuit region, the processes of manufacturing n- and p-channel transistors are executed.

In the first embodiment, the floating gate electrode and control gate electrode of the direct tunneling memory have the same shape. In order to set the characteristics of the floating gate in the direct tunnel region different from the characteristics of the floating gate of the select transistor, ion implantation is performed only for the floating gate electrode of the select transistor in the process shown in FIG. 1G. The height of the gate electrode of the select transistor of the direct tunneling memory is set different from that of the gate electrode of the transistor of the logic circuit. These features are not essential.

FIGS. 3A to 3E are perspective views illustrating manufacture processes for a direct tunneling memory according to the second embodiment of the invention.

Figure 3A:
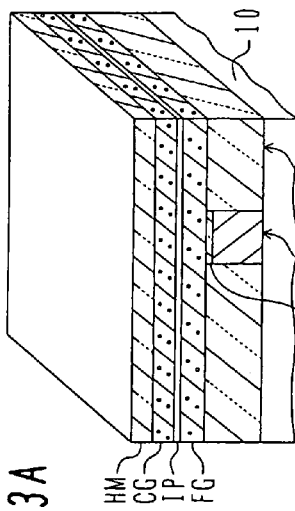
FIGS. 3A to 3E are perspective views illustrating manufacture processes for a direct tunneling memory according to a second embodiment of the invention.

FIG. 3A shows the structure that a floating gate electrode layer FG, an inter-poly insulating layer IP, a control gate electrode layer CG and a hard mask layer HM are stacked on a silicon substrate, by processes similar to those of the first embodiment. This structure corresponds to the structure shown in FIG. 1H.

Figure 3B:
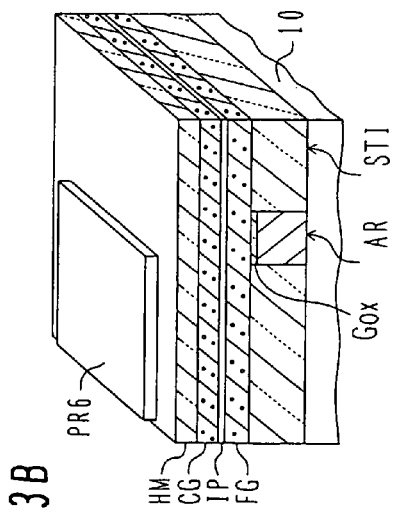

As shown in FIG. 3B, a photoresist pattern PR6 is formed covering the direct tunnel region of the direct tunneling memory. The select transistor region is positioned outside of the photoresist pattern PR6.

Figure 3C:
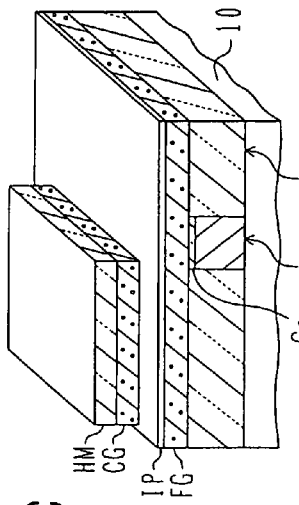

As shown in FIG. 3C, by using the photoresist pattern PR6 as an etching mask, the hard mask layer HM and control gate electrode CG are etched. The photoresist pattern PR6 is thereafter removed by ashing. In the select transistor region, the control gate layer CG is removed and only the floating gate electrode layer FG (and inter-poly insulating layer IP) exist above the channel region.

Figure 3D:
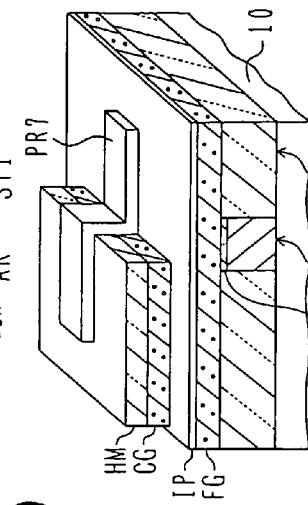

As shown in FIG. 3D, a photoresist pattern PR7 is formed having a shape of the gate electrode of the select transistor. Although the photoresist pattern extends to the direct tunnel region, it is sufficient if the pattern overlaps the hard mask HM.

Figure 3E:
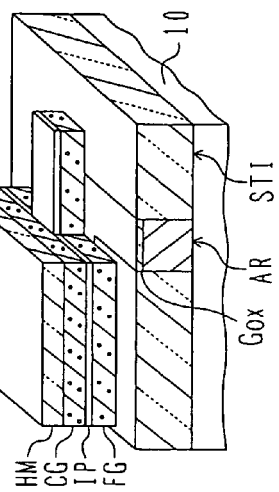

As shown in FIG. 3E, by using the hard mask HM and photoresist pattern PR7 as an etching mask, the inter-poly insulating layer IP and floating gate electrode layer FG are etched. The gate electrode of the select transistor having only the floating gate electrode is therefore formed in the select transistor region.

FIGS. 4A to 4D are cross sectional views illustrating compatibility of the manufacture processes of the second embodiment with logic circuit forming processes.

The structure of the direct tunneling memory is shown on the left side of FIGS. 4A to 4D, and the structure of the logic circuit region is shown on the right side.

Figure 4A:
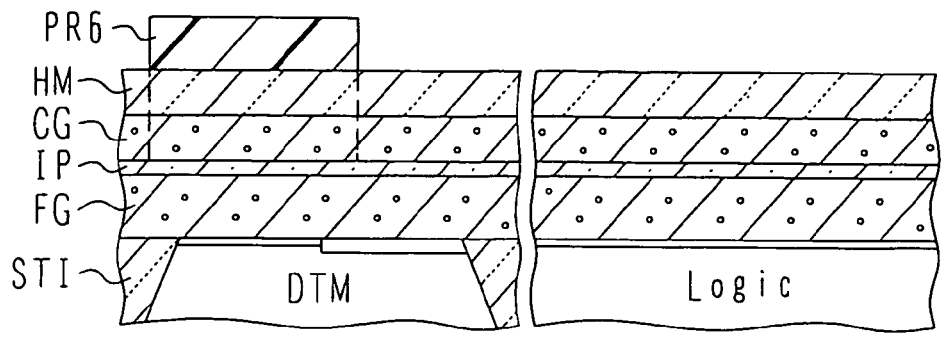
FIGS. 4A to 4D are cross sectional views illustrating the compatibility with logic transistor manufacture processes according to the second embodiment.

FIG. 4A shows the state corresponding to FIG. 3B wherein a floating gate electrode layer FG, a control gate electrode layer CG and a hard mask layer HM are laminated and a photoresist pattern PR6 is formed on this lamination structure. A similar lamination structure is formed in the logic circuit region, and a photoresist pattern is not formed. In this state, the hard mask layer HM and control gate electrode layer CG are etched.

Figure 4B:
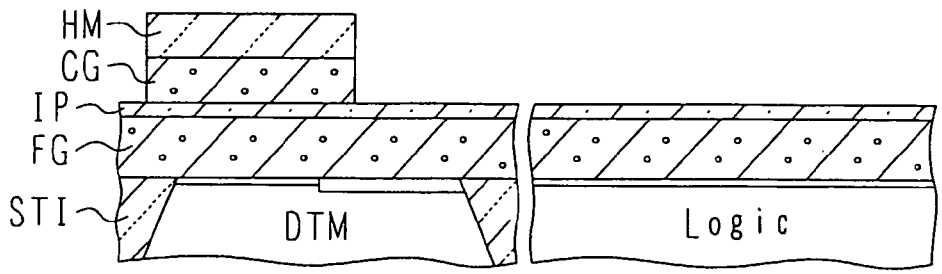

As shown in FIG. 4B, in the logic circuit region, the hard mask layer HM and control gate electrode layer CG are removed completely. In the direct tunneling memory region, the hard mask layer HM and control gate electrode layer CG are patterned in the same shape. The photoresist pattern PR6 is thereafter removed by ashing or the like.

Figure 4C:
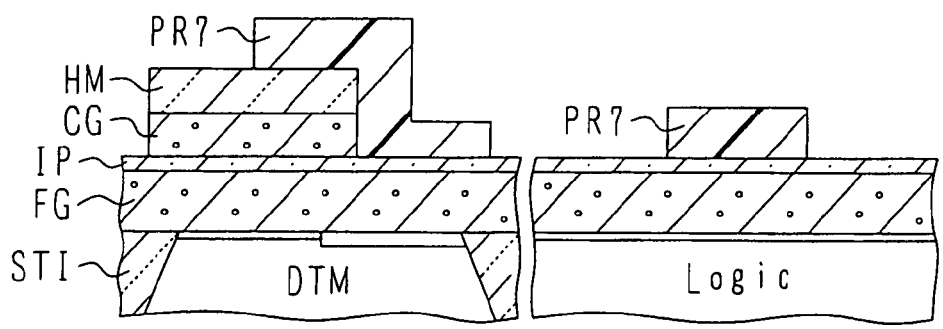

FIG. 4C shows the state that a photoresist pattern PR7 corresponding to gates are formed, and corresponds to FIG. 3D. The photoresist pattern PR7 has the shape corresponding to the gate electrode of the select transistor of the direct tunneling memory and the gate electrode in the logic circuit region. By using the photoresist pattern PR7 and hard mask HM as an etching mask, the inter-poly insulating layer IP and floating gate layer FG are etched. The photoresist pattern PR7 is thereafter removed by ashing or the like.

Figure 4D:
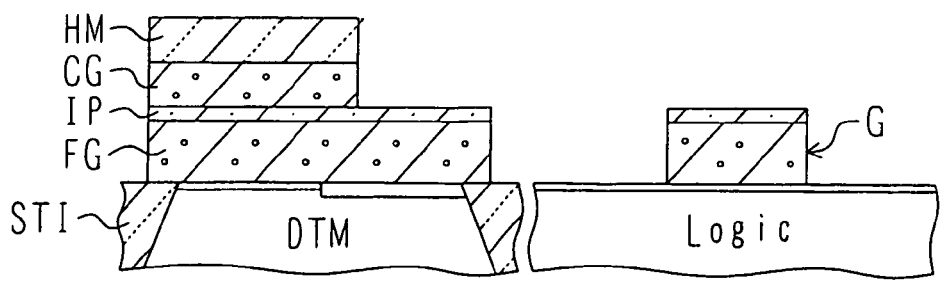

As shown in FIG. 4D, in the logic circuit region, a gate electrode G made of the floating gate electrode layer is disposed, and in the direct tunneling memory region, the gate electrode made of only the floating gate electrode FG is disposed above the select transistor. In the direct tunnel region, the gate electrode is disposed having the lamination structure of the floating gate FG and control gate CG. Thereafter, as ion implantation is performed for forming source/drain regions of a transistor, impurities are implanted also into the gate electrode G of the logic circuit and the floating gage FG of the select transistor. The floating gate FG in the direct tunnel region is shielded from this ion implantation so that a desired low impurity concentration can be maintained.

FIG. 5A shows the outline of the cross sectional structure of a direct tunneling memory manufactured in the manner described above. The right side shows the select transistor and the left side shows the direct tunnel region. In the direct tunnel region, a laminated gate structure of the floating gate electrode and control gate electrode is formed. In the select transistor region, only the floating gate electrode FG is disposed, and the control gate electrode CG is removed.

The control gate electrode CG and floating gate electrode FG are capacitively coupled. As a predetermined bias voltage is applied to the control gate electrode CG, a bias voltage can be applied also to the floating gate electrode FG. As the channel is induced from the select transistor region to the direct tunnel region, carriers can be supplied, for example, from the source region S to the region under the tunnel insulating layer via the channel.

FIG. 5B is a schematic plan layout of the direct tunnel element and select transistor according to the second embodiment. Similar to the first embodiment, a shallow trench isolation STI defines the region where a select transistor is formed and the direct tunnel region. A floating gate electrode FG is formed covering the direct tunnel region and the channel region of the select transistor. Above the floating gate electrode FG in the direct tunnel region, a control gate electrode CG is formed on an inter-poly insulating layer IP. The gate length of the select transistor is L and the gate width is W. The size of the thin tunnel oxide film in the direct tunnel region is DW×DL.

FIG. 5C is a table showing voltages used for the operation of the second embodiment. In a write operation, 5 V is applied to the control gate electrode CG. The source S, drain D and semiconductor substrate B are set to 0 V. In an erase operation, a voltage applied to the control gate electrode is changed to −5 V. Other voltages are the same as those in the write operation. When stored information is to be read by turning on the transistor, 1 V is applied to the control gate CG and drain D. The source S and substrate B are set to 0 V.

Figure 6:
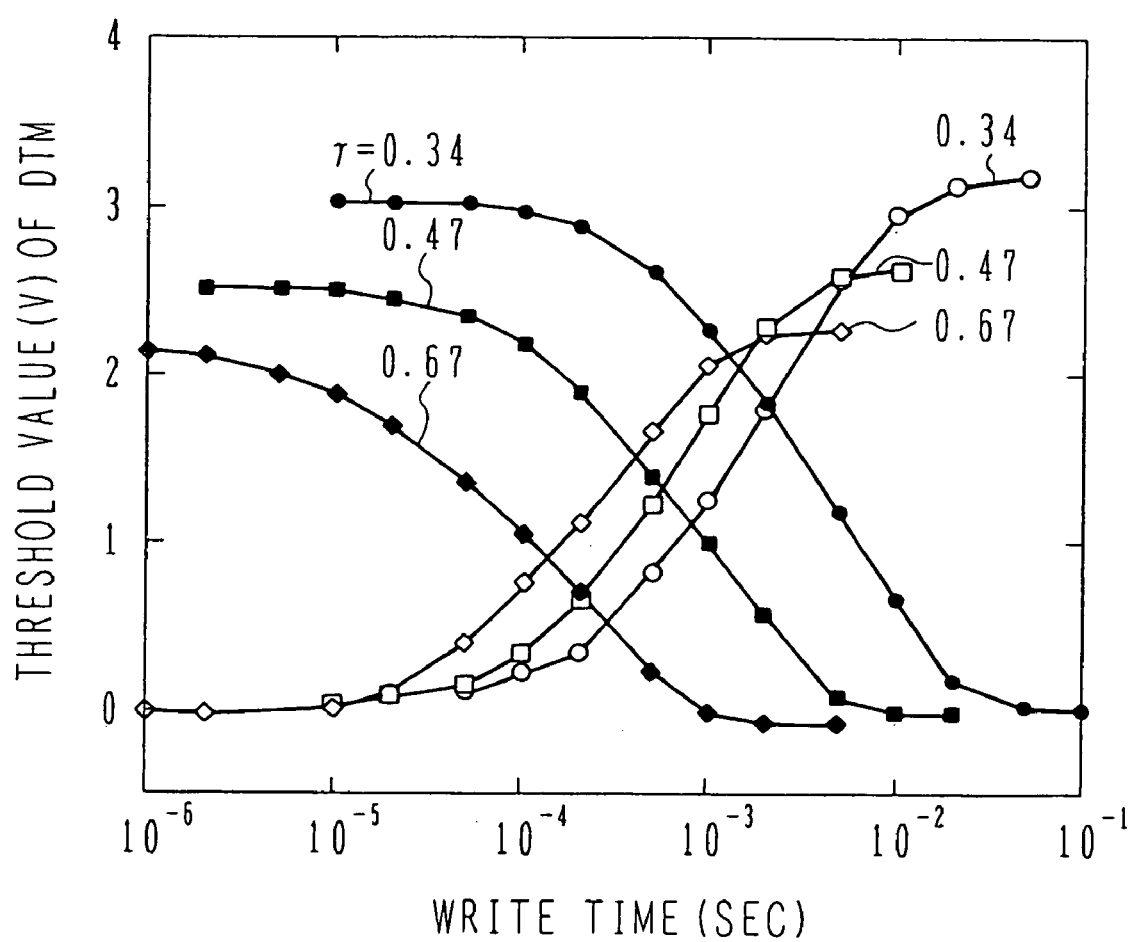
FIG. 6 is a graph showing the characteristics of samples of the second embodiment.
Figure 7:
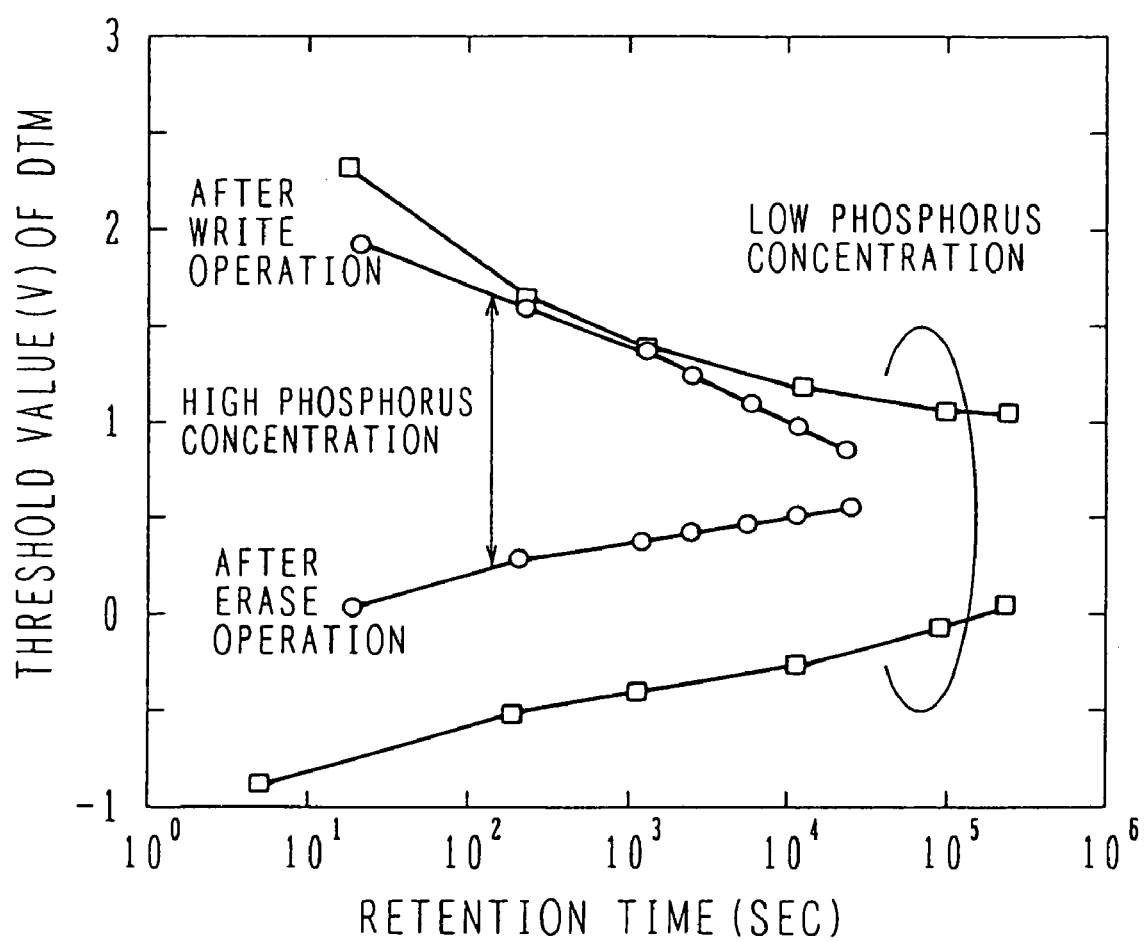
FIG. 7 is a graph showing the characteristics of samples of the second embodiment.

FIGS. 6 and 7 are graphs showing the electrical characteristics of direct tunneling memories manufactured by the second embodiment method. The size of each sample schematically shown in FIGS. 5A and 5B is: a gate length L=0.18 μm; a gate width W=10 μm, the size of the direct tunnel region DL=0.28 μm and DW=10.2 μm. A thickness of the tunnel oxide film in the direct tunnel region is 2.3 nm, and voltages applied to each terminal in the write operation are those shown in the table of FIG. 5C.

Three types of samples were formed which have coupling ratios $\gamma=C_{CG}/(C_{FG}+C_{CG})$ of 0.34, 0.47 and 0.67, where $C_{FG}$ is a capacitance between the substrate and floating gate and $C_{CG}$ is a capacitance between the floating gate and control gate.

FIG. 6 is a graph showing the write/erase characteristics. It can be seen that the write speed is approximately equal to the erase speed and that a higher speed operation is possible by raising the coupling ratio.

FIG. 7 is a graph showing the dependence of the retention characteristics upon a phosphorus concentration. The abscissa represents an elapsed time and the ordinate represents a threshold value. Upper curves indicate a change of the threshold value with time when the threshold value is raised by a write operation (electron injection), and lower curves indicate a change of the threshold value with time when the threshold value is lowered by an erase operation (electron discharge). Although a nonvolatile memory has hardly a threshold change, a direct tunneling memory is volatile and has a change of the threshold value with time. The threshold value changes to a natural neutral state as the time elapses, because of electron leakage from the floating gate to the substrate after the write operation and because of electron injection from the substrate to the floating gate after the erase operation. In order to discriminate between the two states, it is necessary that there is a difference of a predetermined value or larger between the state after the write operation and the state after the erase operation.

It can be understood that the retention time can be improved considerably by lowering the phosphorus concentration even if a thin oxide film is used. If the phosphorus concentration is low, the depletion layer is broadened so that (1) electrons contributing to tunneling are moved away from the oxide film and (2) a voltage applied to the oxide film and substrate is lowered due to a voltage drop by a band bending. Improvement on the retention characteristics may be ascribed to these reasons. As the retention characteristics are improved, the refreshing period can be prolonged and low power consumption can be realized.

In the above-described embodiments, the direct tunnel region is disposed on a line extending from the gate electrode of the select transistor of the direct tunneling memory. The layout of the select transistor and direct tunnel element may be changed in various ways.

Figure 8A:
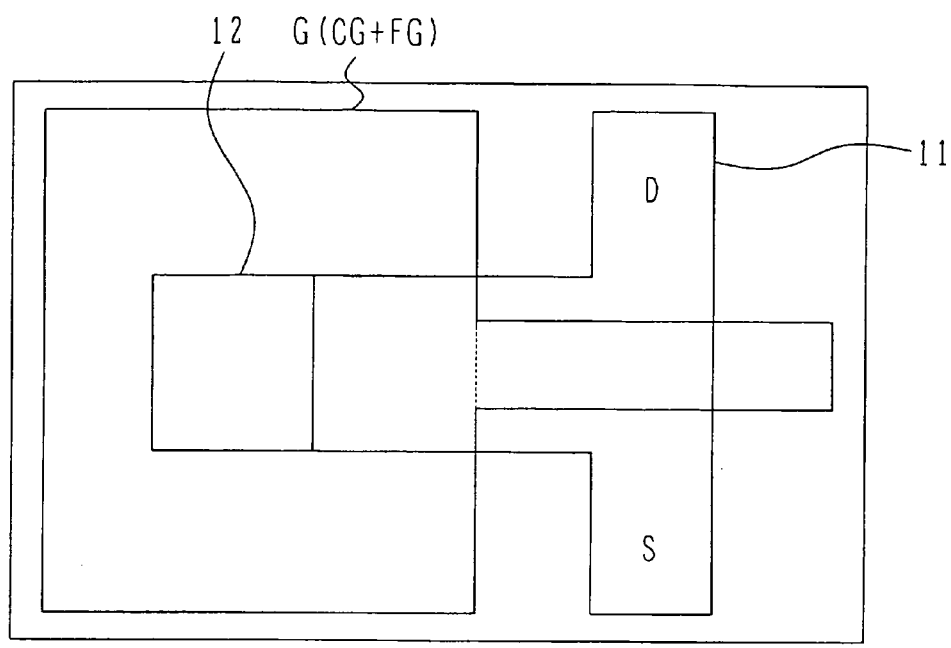
FIGS. 8A and 8B are plan views of the plan layout according to modifications.

FIG. 8A shows the plan layout of the direct tunneling memories of both the first and second embodiments. The select transistor region 11 and direct tunnel region 12 are made of the active region of a T-character shape. The gate electrode G of the lamination of the control gate electrode and floating gate electrode covers the direct tunnel element region 12 and extends above the channel region of the select transistor. The first embodiment has the control gate electrode and floating gate electrode of the same shape, and the second embodiment removes the control gate electrode on the right side of a broken line.

As the channel is induced under the floating gate electrode, the source region S and drain region D having a high $n^+$ concentration are electrically connected to the direct tunnel region via the channel so that carriers can be supplied to the direct tunnel region.

Figure 8B:
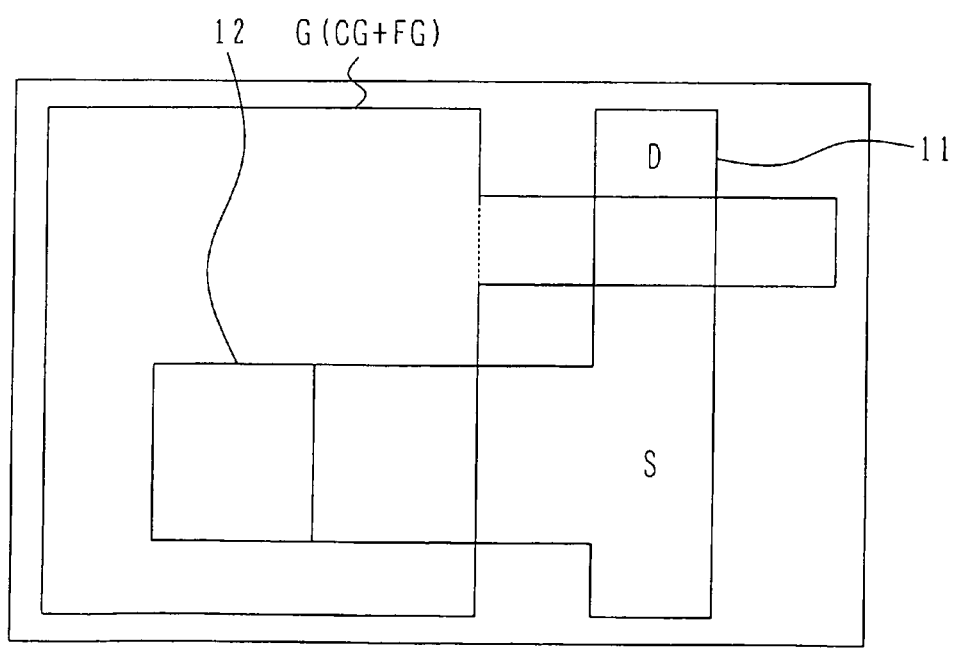

FIG. 8B shows another example of the plan layout. Similar to the example shown in FIG. 8A, the select transistor region 11 and direct tunnel element region 12 are made of the active region of a T-character shape. However, the direct tunnel element region 12 is not disposed on the line extending from the gate electrode G of the select transistor, but is continuous with the source region at the position different from the gate electrode of the select transistor. As ion implantation for the source/drain regions is performed, the source region S extends to the position just under the side wall of the direct tunnel element region. As the channel is induced under the floating gate electrode FG, the direct tunnel region and source region are connected by the channel. If the gate electrode of the select transistor is made of only the floating gate electrode, the control gate electrode on the right side of a broken line is removed.

Figure 9:
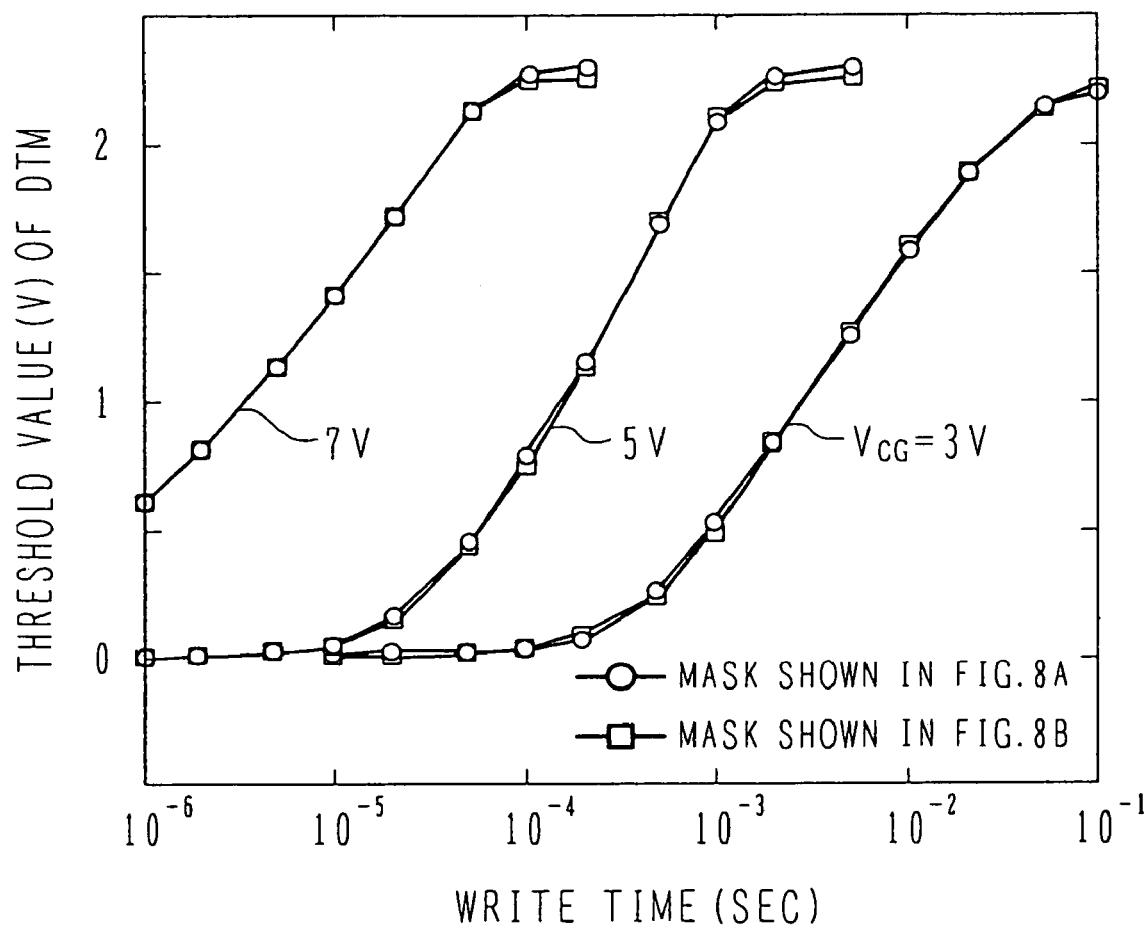
FIG. 9 is a graph showing a change in the characteristics when a mask pattern of FIG. 8 is changed.

FIG. 9 is a graph showing an example of measurements of the write characteristics of direct tunneling memories using the mask patterns shown in FIGS. 8A and 8B. The gate length L is 0.18 µm, the gate width W is 10 µm, the size of the direct tunnel region is DL=0.28 µm and DW=10.2 µm. The thickness of the tunnel oxide film of the direct tunnel region is 2.3 nm and the voltages at respective terminals in a write operation are those shown in the table of FIG. 5C. The write characteristics are almost the same independently from the mask patterns.

Figure 10A:
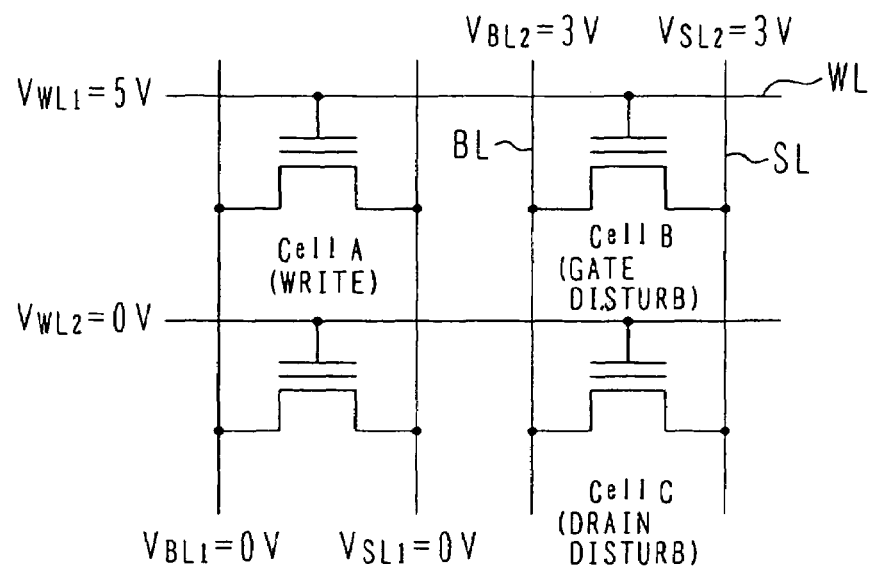
FIGS. 10A and 10B are an equivalent circuit diagram and a graph showing the cell layout of a direct tunneling memory and disturb characteristics.
Figure 10B:
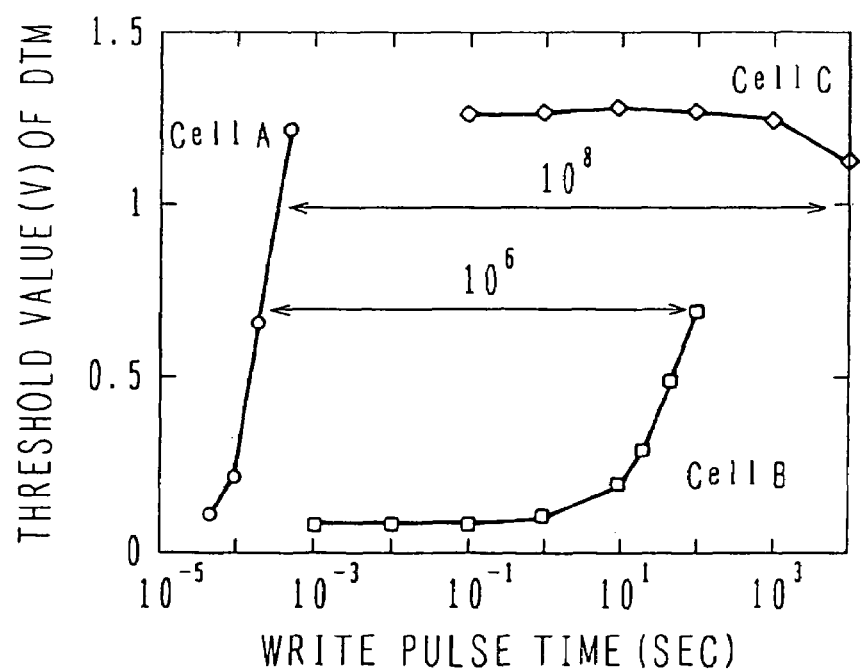
Figure 11A:
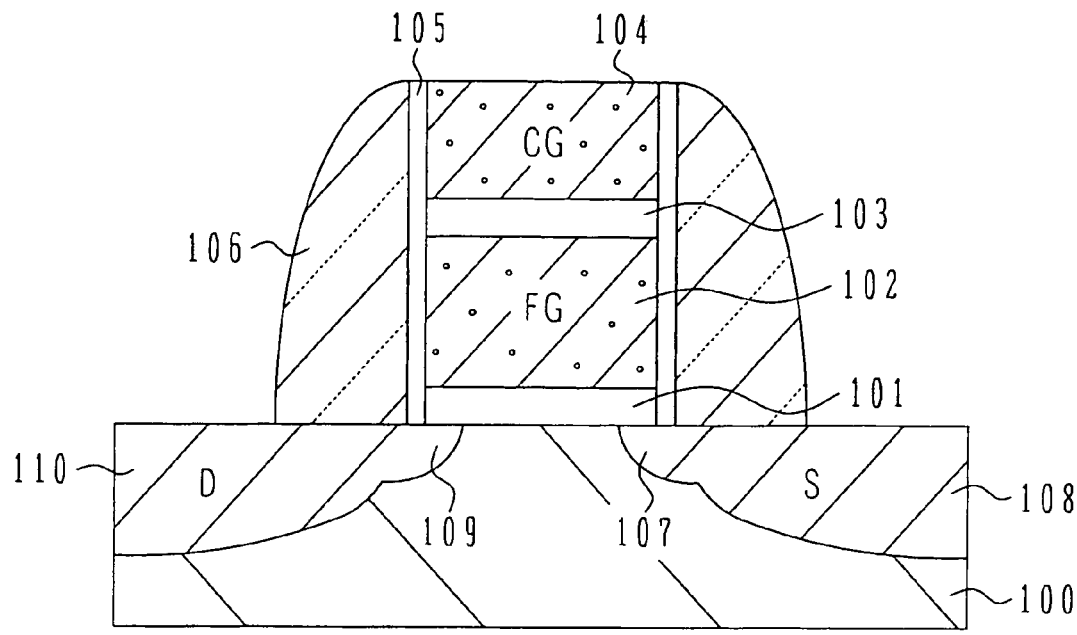
FIGS. 11A and 11B are cross sectional views illustrating conventional technologies.
Figure 11B:
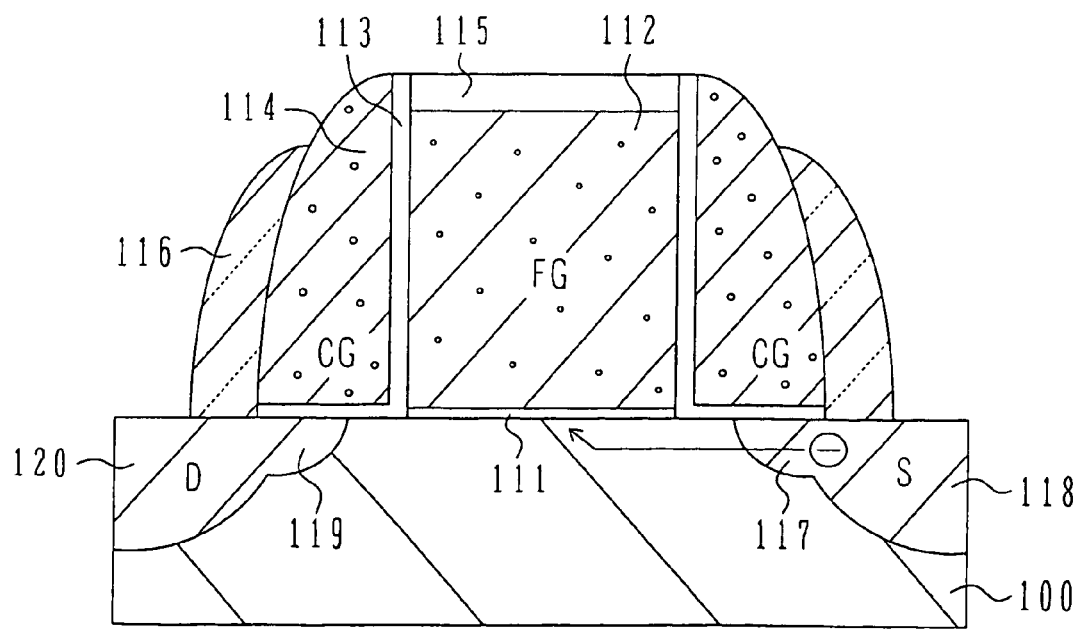

FIGS. 10A and 10B show an example of the circuit arrangement of direct tunneling memories and their characteristics. FIG. 10A shows an AND type cell layout. Word lines WL connected to the gate of each cell extend in the row direction. Source lines SL connected to the source of each cell and bit lines BL connected to the drain of each cell extend in the column direction. When data is to be written to a cell A, $W_{WL1}$=5 V is applied to the word line of the cell A, and the source line and bit line are set to 0 V. The source lines and bit lines of other columns are set to 3 V. The gate disturb of a cell B adjacent to the cell A and the drain disturb of a cell C one line below the cell B are shown in FIG. 10B. The gate disturb of the cell B has a ratio of $10^6$ or higher and the drain disturb of the cell C has a ratio of $10^8$ or higher. It can be understood that the disturbance can be suppressed more effectively than a conventional direct tunneling memory.

The present invention has been described in connection with the preferred embodiments. The invention is not limited only to the above embodiments. For example, the gate insulating film and tunnel insulating film may be made of different materials. A laminated insulating film may be used in addition to a single layer insulating film. As the gate insulating film, well-known various insulating films or laminated insulating films may be used. Gate insulating films and tunnel insulating films having different film thicknesses may be formed by two or more oxidation processes, a combination of decelerated ion implantation, accelerated ion implantation and one oxidation process, and other methods.

Although the tunnel insulating film is made of silicon oxide in the above description, the tunnel insulating film may be made of one or more insulating materials selected from Si-containing oxide, nitride and oxynitride such as SiO, SiN, and SiON (composition is omitted). The tunnel insulating film may be made of one or more materials selected from oxide, nitride, silicide, oxynitride, nitride silicide, silicate, and silicate nitride which contain one or more metals such as Al, Hf and Zr. For example, these materials are AlO, HfO, ZrO, HfSiO, ZrSiO, HfSiON, ZrSiON, HfAlO and HfAlON (composition is omitted).

It will be apparent to those skilled in the art that other various modifications, improvements, combinations, and the like can be made.

What is claimed is:

1. A semiconductor device comprising:
   a semiconductor substrate;
   an isolation region formed on said semiconductor substrate and defining a continuous active region including a select transistor region and a direct tunnel element region;
   a gate insulating film formed on a channel region of said select transistor region;
   a tunnel insulating film formed on a partial area of said direct tunnel element region and having a thickness different from a thickness of said gate insulating film;
   a continuous floating gate electrode formed above an area including said gate insulating film and said tunnel insulating film;
   an inter-electrode insulating film formed on a surface of said floating gate electrode;
   a control gate electrode facing said floating gate electrode via said inter-electrode insulating film; and
   a pair of source/drain regions formed on both sides of the channel region of said select transistor region and not overlapping said tunnel insulating film.

2. The semiconductor device according to claim 1, wherein said source/drain regions and a region under said tunnel insulating film of said direct tunnel element region are electrically connected in a state when a forward bias is applied to said floating gate electrode and a channel is induced under said floating gate electrode.

3. The semiconductor device according to claim 1, wherein said tunnel insulating film does not exist on a transport region of carriers transported between said pair of source/drain regions.

4. The semiconductor device according to claim 1, wherein said select transistor region and said direct tunnel element region form a T-character shaped active region, and said tunnel insulating film is formed in an area of a vertical bar of the T-character shape.

5. The semiconductor device according to claim 4, wherein said floating gate electrode constitutes a gate of a select transistor above a horizontal bar at a connecting base portion of the vertical bar of the T-character shape and extends covering the vertical bar.

6. The semiconductor device according to claim 4, wherein said floating gate electrode constitutes a gate of a select transistor by traversing one side of a horizontal bar of the T-character shape.

7. The semiconductor device according to claim 1, further comprising a hard mask layer formed on said control gate electrode, and said control gate electrode, said inter-electrode insulating film and said floating gate electrode have a plan shape self-aligned with said hard mask layer.

8. The semiconductor device according to claim 1, wherein said control gate electrode is not disposed above said select transistor region, and a gate electrode of a select transistor is made of only said floating gate electrode.

9. The semiconductor device according to claim 1, wherein said isolation region also defines a logic transistor region in said semiconductor substrate, and the semiconductor device further comprises:

other gate insulating films formed on channel regions of said logic transistor region; and a logic gate electrode formed on each of said other gate insulating films and made of a same layer as a layer of said floating gate electrode.

10. The semiconductor device according to claim 9, wherein said logic transistor region includes a plurality type of said other gate insulating films and a thickness of one of said other gate insulating films is equal to a thickness of said gate insulating film.

* * * * *